United States Patent
Miller et al.

[11] Patent Number: 5,821,013
[45] Date of Patent: Oct. 13, 1998

[54] VARIABLE STEP HEIGHT CONTROL OF LITHOGRAPHIC PATTERNING THROUGH TRANSMITTED LIGHT INTENSITY VARIATION

[75] Inventors: Gayle W. Miller; Brian R. Lee, both of Colorado Springs, Colo.

[73] Assignee: Symbios, Inc., Fort Collins, Colo.

[21] Appl. No.: 763,373

[22] Filed: Dec. 13, 1996

[51] Int. Cl.$^6$ .................................................. G03F 9/00
[52] U.S. Cl. ............................................................. 430/5
[58] Field of Search ......................... 430/5, 322; 378/34, 378/35

[56] References Cited

U.S. PATENT DOCUMENTS

| | | | |
|---|---|---|---|
| 4,231,811 | 11/1980 | Somekh et al. | 148/1.5 |
| 4,746,587 | 5/1988 | Nicholas | 430/5 |
| 4,902,899 | 2/1990 | Lin et al. | 430/5 |
| 5,187,726 | 2/1993 | White | 378/35 |
| 5,343,292 | 8/1994 | Brueck et al. | 356/363 |
| 5,356,738 | 10/1994 | Inoue et al. | 430/5 |
| 5,447,810 | 9/1995 | Chen et al. | 430/5 |
| 5,476,738 | 12/1995 | Yuan | 430/30 |
| 5,543,253 | 8/1996 | Park et al. | 430/5 |
| 5,679,484 | 10/1997 | Ito et al. | 430/322 |

*Primary Examiner*—S. Rosasco
*Attorney, Agent, or Firm*—Duke W. Yee; Wayne P. Bailey

[57] ABSTRACT

A method and apparatus for forming layers of photo-sensitive materials in different thicknesses. A mask including a first area that substantially blocks light transmission and a second area having optical characteristics, which partially blocks light transmission is employed. Light is projected through the mask onto a layer of photo-sensitive material. The first area substantially blocks the light from passing through and leaves portions of the photo-sensitive material unexposed. The secondary area reduces the intensity of light passing through the mask and projected onto other portions of the photo-sensitive material. After developing the photo-sensitive material, at least two thicknesses of photo-sensitive material results. The second area may include a number of sections that vary from each other in optical characteristics such that the intensity of the light projected onto the layer of photo-sensitive material through the second area varies in steps or continuously.

29 Claims, 2 Drawing Sheets

VARIABLE STEP HEIGHT CONTROL OF LITHOGRAPHIC PATTERNING THROUGH TRANSMITTED LIGHT INTENSITY VARIATION

BACKGROUND OF THE INVENTION

1. Technical Field

The present invention relates generally to the field of semiconductor device fabrication and in particular to photolithographic processes used in the manufacture of semiconductor devices. Still more particularly, the present invention relates to variable step height control of photoresist thicknesses through transmitted light intensity variation.

2. Description of the Related Art

In photolithographic fabrication of integrated circuits, photo-sensitive layers, referred to commonly as photoresist layers, are exposed to light, which is projected onto the photoresist layers though a masking member or reticle. After the photoresist layers are developed, the pattern is defined by the masking member and then used to form various circuit elements and regions. Most often, the masking member has opaque and transparent areas, which result (after the photoresist is developed) into regions of photoresist material and regions without such material.

Current semiconductor integrated circuit device manufacturing processes requires several masking steps in which photoresist is formed on the device and masked with selected portions of the photoresist being exposed to light and developed to form exposed and unexposed regions on the device. Dopants are then implanted or etching is performed. For some semiconductor devices, several masking steps are required for implanting a common dopant species or for etching multiple patterns into common or dissimilar film stacks or substrates. For example, for some integrated circuit devices, multiple penetration depths into a silicon substrate require multiple patterning steps to produce more than two implant penetration depths.

In some applications, such as multiple depth implants, it is desirable to have a photoresist layer (after developing) that has regions of different thicknesses. This varied thickness is desirable to reduce the number of steps needed to manufacture the device. One method includes exposing the photoresist layer to different masking members in different masking steps. Such a process, however, can result in misalignments, which are inherent when more than one masking member is used.

One process for producing a photoresist layer with regions of different thicknesses is disclosed in U.S. Pat. No. 4,231,811, which discloses a process for forming with a single masking step, regions of different thicknesses in a photo-sensitive layer. A masking member or reticle includes opaque and transparent areas and areas with a grating. The pitch of the periodic grating is of a lesser dimension than can be resolved by the masking projection apparatus. The photo-sensitive region illuminated by the grating receives uniform illumination at an intermediate intensity, thereby providing, after developing, a layer with regions of intermediate thickness. This process, however, requires a mask that employs a grating with lines or features below the resolution limit of the apparatus. While these features may be below the resolution limit of one projection apparatus, the same may not be true for the same features in another projection apparatus. Consequently, a mask may not be usable for different projection apparatuses. Also, manufacturing capabilities of defining a sub-resolution grating on a mask might be limited. By imaging on a partial transmission medium, the contrast of the grating will be reduced. This will have 2 possible effects. (1) The image quality of the grating becomes less critical, and/or (2) the resolution limit of the stepper will be degraded, allowing a less aggressive grating pitch on the mask.

The use of a grating requires a very stable photoresist process. If a resist is changed, or the optical characteristics of the lens system is altered, the resolution limit of the stepper may change. This will change the partial exposure in the photoresist on the wafer.

The illumination through the grating will have some periodic effect on the illumination. The uniformity of such illumination might be problematic when printing over other features in the substrate or over materials of varied reflectivity.

Therefore, it would be advantageous to have a method and apparatus for varying the thickness of a photoresist layer that is constant between different apparatus having different resolution limits.

SUMMARY OF THE INVENTION

The present invention provides a method and apparatus for forming layers of photo-sensitive materials in different thicknesses. A mask including a first area that substantially blocks light transmission and a second area having optical characteristics, which partially blocks light transmission is employed. Light is projected through the mask onto a layer of photo-sensitive material. The first area substantially blocks the light from passing through and leaves portions of the photo-sensitive material unexposed. The secondary area reduces the intensity of light passing through the mask and projected onto other portions of the photo-sensitive material. After developing the photo-sensitive material, at least two thicknesses of photo-sensitive material results. The second area may include a number of sections that vary from each other in optical characteristics such that the intensity of the light projected onto the layer of photo-sensitive material through the second area varies in steps or continuously.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION

Figure 1:
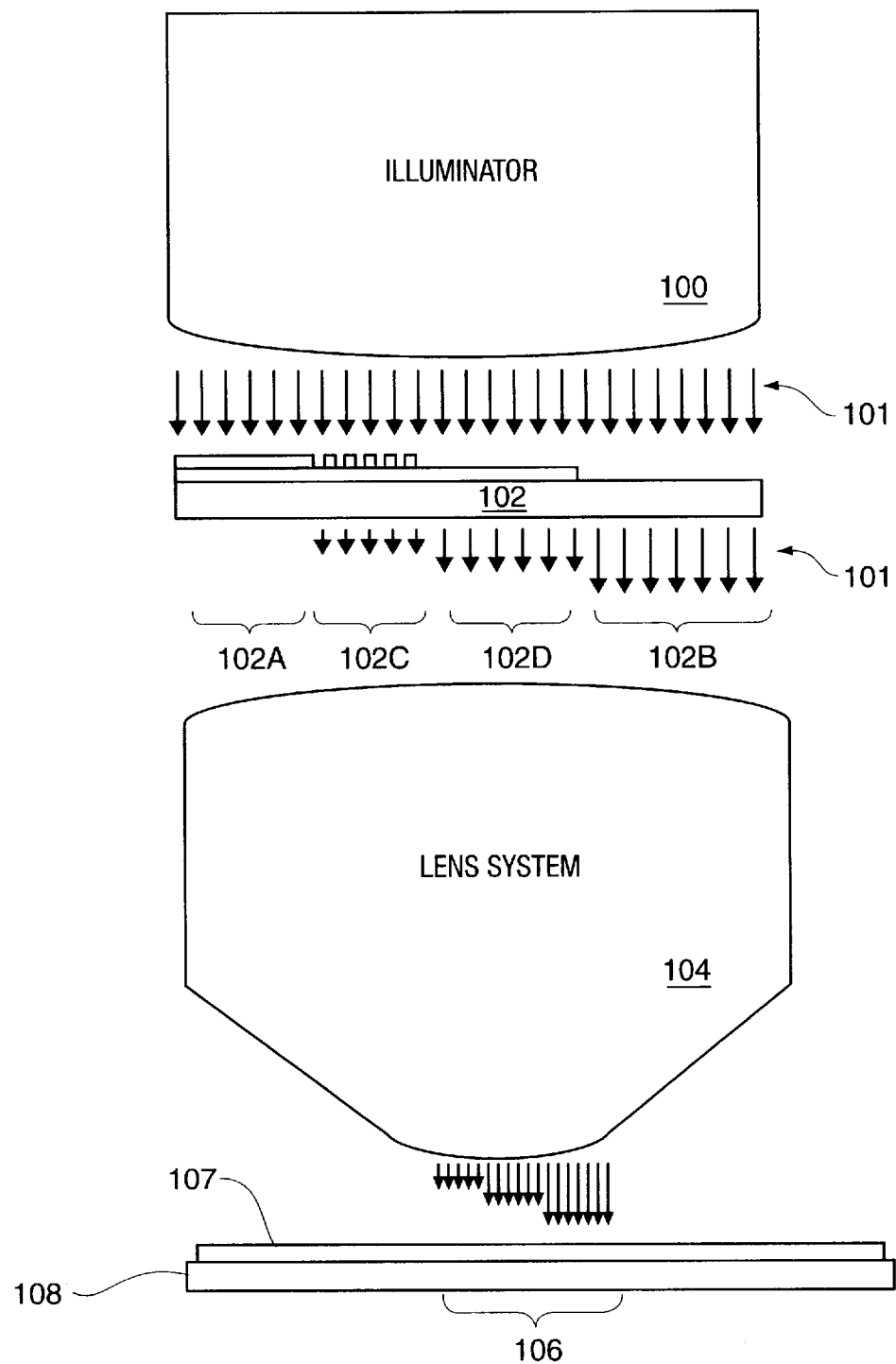
FIG. 1 is an illustration of a masking projection apparatus depicted in accordance with a preferred embodiment of the present invention.

With reference now to the figures, and in particular with reference to FIG. 1, an illustration of a masking projection apparatus is depicted in accordance with a preferred embodiment of the present invention. Illuminator 100 directs light, shown as arrows 101, through a mask or reticle 102. The light from mask 102 is projected by a lens system 104 onto an area 106 of wafer 108. In this manner, a photoresist layer 107 on wafer 108 is exposed and patterns are defined corresponding to those on mask 102. The projection apparatus, and in particular lens system 104, is able to resolve only images greater than some predetermined dimension. Mask 102 includes opaque areas and transparent areas as can be seen in areas 102a and 102b. Light passing through transparent areas 102b pass through at full intensity while opaque areas result in none of the light passing through or a zero intensity. Mask 102 also includes spaced apart parallel lines of a predetermined line width spacing as illustrated in area 102c. Mask 102 also includes semi-transparent area 102d, which allows light to pass through area 102d with a lessened intensity. The different length of arrows 101 indicate the different intensities of light passing through mask 102.

Figure 2A:
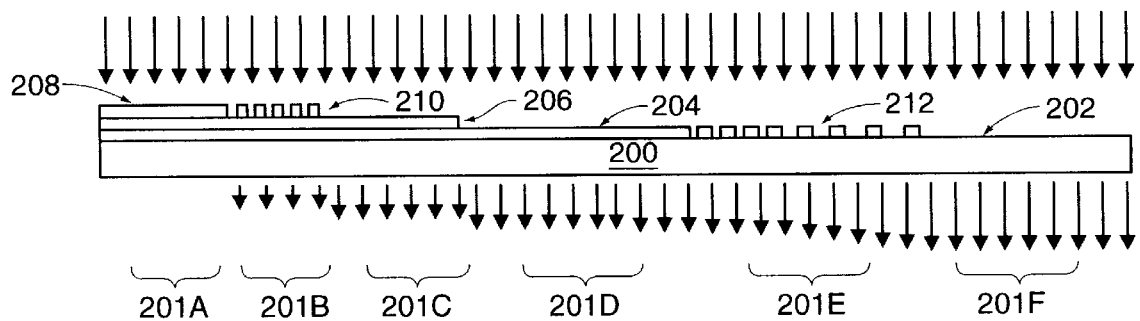
FIGS. 2A–2E depict the result of using a mask configured in accordance with a preferred embodiment of the present invention.

With reference now to FIGS. 2A–2E, the results of using mask 200 configured in accordance with a preferred embodiment of the present invention are depicted. In FIG. 2A, mask 200 contains sections 201a–201f, which with each section providing for different amounts of light transmission through mask 200. Mask 200 includes a transparent material 202, partial transmission material 204 (which is semi-transparent), partial transmission material 206 (which is semi-transparent), and opaque material 208. These various materials are layered as illustrated in FIG. 2A. In addition, opaque material 208, partial transmission material 204, and partial transmission material 206 may be patterned with lines to form a grid, such as grid 210 in section 201b or grid 212 in section 201e. In the depicted example, grid 210 in section 201b is formed from opaque material 208 while grid 212 in section 201e is formed from partial transmission material 204. The pitch of the lines in grid 210 are steady while the pitch in grid 212 varies to change the amount of light passed through section 201e on mask 200. Section 201f of mask 200 contains only a transparent portion 202. Section 201d contains transparent material 202 portion and partial transmission material 204 portion. Section 201c contains transparent material 202, partial transmission material 204 and partial transmission material 206. Section 201b contains transparent material 202, partial transmission material 204, partial transmission material 206, and grid 210 with lines below the resolution limit of the projection apparatus. Grid 210 may use lines that are parallel or lines that form other patterns. Section 201a contains transparent portion 202, partial transmission portion 204, partial transmission portion 206, and opaque portion 208.

Figure 2B:
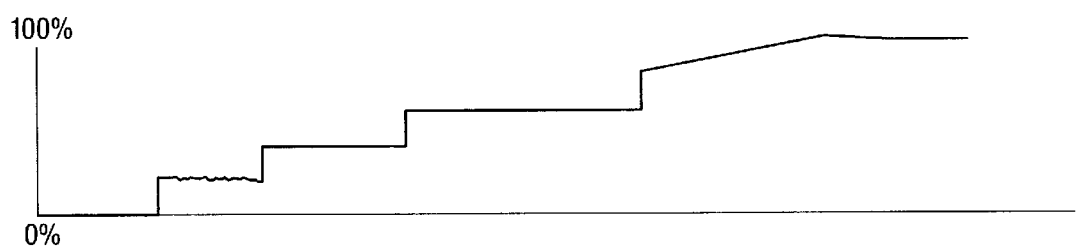
Figure 2C:
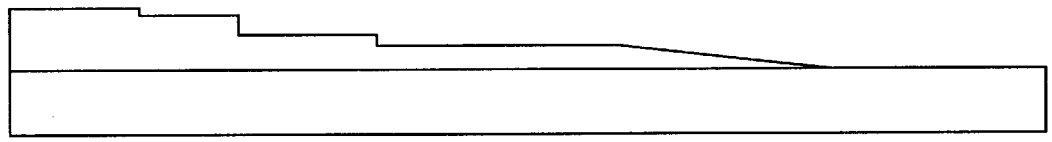

Next, FIG. 2B shows the optical intensity of light passing through mask 200 with the y-axis ranging from zero to 100 percent of the intensity of light from illuminator 100 and the x-axis corresponding to different areas of mask 200 in FIG. 2A. As can be seen, the light intensity is near 100 percent in section 201e, but less than 100 percent, which is caused by partial transmission material 204 in section 201d. As can be seen in section 201e, partial transmission material 204 is patterned to form lines such that the amount of light transmitted through section 201e is increased over that of section 201d. In section 201e, the pitch of the lines increase to increase the amount of light passing through section 201e, as illustrated in FIG. 2B. Section 201c intensity is reduced by the amount in section 201d, and by an additional amount from partial transmission material 206. Section 201b intensity is the commutation of partial transmission material 204, partial transmission material 206, and the intensity loss resulting from the subresolution grating formed by grid 208. The optical intensity reaches zero in section 201a where the mask material is opaque. FIG. 2C shows the different photoresist thickness as a result of the exposure to different light intensities after development of the photoresist.

Figure 2D:
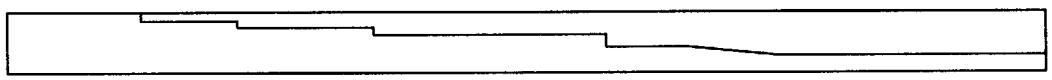
Figure 2E:
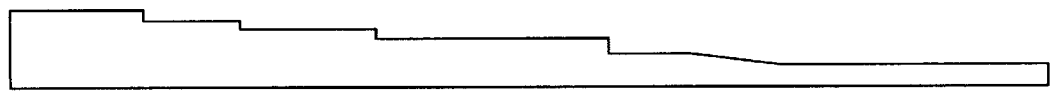

FIG. 2D shows the different implant penetrations that are achieved in a p-type substrate using an n-type implant in accordance with a preferred embodiment of the present invention. FIG. 2E shows differential etch removal achieved through the varied resist thickness in accordance with a preferred embodiment of the present invention. The photoresist does not act as an absolute etch block in this case as illustrated in FIG. 2E, rather the rate of photoresist consumed in an etch is intended to be controlled relative to the rate of the consumption of the targeted material. By allowing the photoresist to be consumed at a similar rate as the target medium will result in multiple depths of etch. The etch process will immediately consume the target material in an area where there is no photoresist protection. The etch will also consume photoresist. When the thinnest area of photoresist is consumed, consumption of the target material begins. This will create a differential step height in the target material between the unprotected and the variable partially protected regions.

The photoresist also can act as a near absolute etch block to pattern the exposed region of the substrate. In this case, the exposed region of the substrate is etched to a predetermined depth with an etch process that has a high removal rate for the substrate material, but a very low removal rate for the photoresist. The next step would be to expose the wafer to an etch process which has a high removal rate for the photoresist, but a low removal rate for the substrate material. This etch would be timed to only remove a thickness of resist comparable to the thinnest region of photoresist. At the conclusion of this step, the thinnest section of photoresist (as defined by section 201e in FIG. 2A) would be removed. The remaining resist pattern can be used to define a second pattern in the substrate with an etch process that has a high removal rate for the substrate material, but a low removal rate for photoresist. This process can be repeated for the number of resist steps defined by the original patterning process. It should be noted that the substrate material can be common through each of the etch steps, or can be a combination of unique and/or common materials and/or etch processes.

Thus, the present invention provides an improved method and apparatus for varying the thickness of a photoresist layer. The present invention provides a mask that may be used between different apparatuses having different resolution limits when the amount of lights passed through the mask depends solely upon the transmission materials and not on grids. Thus, without grids 210 and 212 in sections 201b and 201e respectively, mask 200 may be used between different apparatuses having different resolution limits without requiring alterations according to the present invention.

Partial transmission material 204 and/or partial transmission material 206 may have optical characteristics which vary with thickness. Thus, a region such as section 201c may include multiple layers having varying widths of partial transmission material 204 and/or 206, resulting in a plurality of sections. Each section is such an arrangement would have a different thickness of partial transmission material 204 or 206 and thus would have optical characteristics which differed from other sections within the region so that the intensity of light transmitted through the region varied with each of the plurality of sections. The sections may be arranged in stepwise thicknesses when traversing the region from an edge, resulting in optical characteristics such that the intensity of light transmitted through the region varies in stepwise fashion with distance from an edge of the region. Alternatively, the thickness may be varied gradually, resulting in optical characteristics such that the intensity of light transmitted through the region varies linearly with distance from an edge of the region.

Partial tranmsission materials may be formed from various films that are semi-transparent, such as for example an oxide film or molybdenum silicide. Additionally, in addition to varying thicknesses, the semi-transparent material may have varied optical characteristics such that the intensity of light transmitted through the region varies linerally with the distance from an edge of the region based on the composition of the film itself.

The description of the preferred embodiment of the present invention has been presented for purposes of illustration and description, but is not intended to be exhaustive or limit the invention in the form disclosed. Many modifications and variations will be apparent to those of ordinary skill in the art. The embodiment was chosen and described in order to best explain the principles of the invention and the practical application to enable others of ordinary skill in the art to understand the invention for various embodiments with various modifications as are suited to the particular use contemplated.

What is claimed is:

1. A method for forming a photo-sensitive material during fabrication of an integrated circuit:

providing a masking member including a first area, which substantially blocks light transmission and a second area having optical characteristics, which partially blocks light transmission, wherein the second area includes a plurality of parallel lines forming a subresolution grid, wherein the plurality of parallel lines has a pitch in which the pitch varies;

projecting light through the masking member onto a layer of the photo-sensitive material, wherein the light has an intensity, the first area substantially blocks the light from passing through the masking member, and the second area reduces the intensity of the light projected onto the layer of photo-sensitive material; and developing the photo-sensitive material, wherein the layer of photo-sensitive material has at least two thicknesses.

2. The method of claim 1, wherein the plurality of parallel lines vary in pitch such that the intensity of light projected onto the layer of photo-sensitive material through the second area varies in stepwise fashion with a distance from an edge of the second area.

3. The method of claim 1, wherein the masking member includes a third area, which substantially passes all of the light onto the photo-sensitive material.

4. The method of claim 1, wherein the second area having optical characteristics, which partially blocks light transmission includes a layer of a first partial transmission material.

5. The method of claim 4, wherein the second area includes a portion having the layer of the first partial transmission material with another layer of the partial transmission material.

6. The method of claim 4, wherein the second area includes a second layer formed over the first layer, wherein the second layer is comprised of a second partial transmission material.

7. The method of claim 1, wherein the second area has optical characteristics which vary such that the intensity of light projected onto the layer of photo-sensitive material through the second area varies with a distance from an edge of the second area.

8. A method for forming photoresist layer during fabrication of an integrated circuit:

providing a masking member including a first area having a first material, which substantially blocks light transmission and a second area having a material with optical characteristics, which partially blocks light transmission, wherein the material is a layer of partial transmission material, wherein the layer is a continuous layer having substantially uniform thickness and wherein the optical characteristics of the layer varies within the second area such that an intensity of light projected through this layer varies with the optical characteristics;

projecting light having a first intensity through the masking member onto the photoresist layer, wherein the first area substantially blocks the light from passing through the mask and the first intensity of the light passing through the second area is reduced to a second intensity; and developing the photoresist layer, wherein the photoresist layer has at least two thicknesses.

9. The method of claim 8, wherein the masking member includes a third area, which substantially passes all of the light onto the photoresist layer.

10. The method of claim 8, wherein the layer of partial transmission material in the second area has a plurality of sections in which the optical characteristics in a section of the plurality of sections varies from another section in the plurality of sections such that the intensity of light transmitted through the second area varies with each of the plurality of sections.

11. The method of claim 10, wherein the plurality of sections are arranged such that the intensity of light transmitted through the second area varies in stepwise fashion with a distance from an edge of the second area.

12. The method of claim 8, wherein the second area has optical characteristics which vary such that the intensity of light transmitted through the second area varies with a distance from an edge of the second area.

13. The method of claim 8, wherein the masking member has a fourth area including a plurality of spaced apart features of predetermined dimensions and spacings.

14. A mask for use in forming a layer of photo-sensitive material comprising:

a first area, which substantially blocks light transmission; and a second area having a material with optical characteristics that partially blocks light transmission, wherein the material includes a plurality of parallel lines forming a subresolution grid, wherein the plurality of parallel lines has a pitch in which the pitch varies, wherein light projected onto the mask has an intensity and wherein the first area substantially blocks the light from passing through the mask and the second area reduces the intensity of the light passing through the mask in the second area onto the layer of photo-sensitive material.

15. The mask of claim 14 further comprising a third area having material with optical characteristics that partially blocks the light such that light passing through the mask in the third area is reduced in intensity in an amount that is different from the second area.

16. The mask of claim 14, wherein the second area has a plurality of sections in which the optical characteristics of one section within the plurality of sections varies from another section within the plurality of sections such that the reduction of the intensity of light passed through the second area varies with each of the plurality of sections.

17. The mask of claim 16, wherein the plurality of sections are arranged such that the intensity of light transmitted through the second area varies in stepwise fashion with a distance from an edge of the second area.

18. The mask of claim 14, wherein the second area has optical characteristics which vary such that the intensity of light transmitted through the second area varies with a distance from an edge of the second area.

19. The mask of claim 14, wherein the mask includes a third area, which substantially passes all of the light onto the third area of the mask.

20. A photoresist mask comprising:

at least one area having a substantially uniform layer of material which partially blocks light transmission in a manner varying with a distance from an edge of the area; wherein light projected onto the mask has an intensity and the intensity of light transmitted through the area varies with the distance from the edge of the area.

21. The photoresist mask of claim 20, wherein the material partially blocks light transmission in a manner varying in stepwise fashion with the distance from the edge.

22. The photoresist mask of claim 20, wherein the intensity of light transmitted through the area varies in stepwise fashion with the distance from the edge.

23. The photoresist mask of claim 20, wherein the intensity of light transmitted through the area varies as a gradient with the distance from the edge.

24. The photoresist mask of claim 20, wherein the material comprises an film selected from the group consisting of oxide and molybdenum silicide and wherein the film varies in thickness with the distance from the edge.

25. A mask for use in forming a layer of photo-sensitive material comprising:

a first area, which substantially blocks light transmissions; and a second area having a layer of a material with optical characteristics that partially block light transmission and a plurality of separate sections spaced apart from each other, wherein the plurality of separate sections are located on the layer of material and form a sub-resolution grid or the layer.

26. The mask of claim 25, wherein the plurality of separate sections are a plurality of lines.

27. The mask of claim 26, wherein the plurality of lines are a plurality of parallel lines.

28. The mask of claim 26, wherein the plurality of lines are formed from a material with optical characteristics that partially blocks light transmission.

29. The mask of claim 25, wherein in the plurality of separate sections are formed from a material with optical characteristics that partially blocks light transmission.

* * * * *